US012069452B2

(12) United States Patent
Sakai

(10) Patent No.: US 12,069,452 B2
(45) Date of Patent: Aug. 20, 2024

(54) AUDIO CIRCUIT FOR INTERFACING WITH DIGITAL OR ANALOG AUDIO SIGNALS

(71) Applicant: ROHM CO., LTD., Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 187 days.

(21) Appl. No.: 17/722,983

(22) Filed: Apr. 18, 2022

(65) Prior Publication Data

US 2022/0240014 A1 Jul. 28, 2022

Related U.S. Application Data

(63) Continuation of application No. PCT/JP2020/037262, filed on Sep. 30, 2020.

(30) Foreign Application Priority Data

Oct. 18, 2019 (JP) ................................ 2019-191304

(51) Int. Cl.

*H04R 3/12* (2006.01)
*H03F 3/347* (2006.01)
*H04R 5/04* (2006.01)

(52) U.S. Cl.

CPC ............... *H04R 3/12* (2013.01); *H03F 3/347* (2013.01); *H04R 5/04* (2013.01); *H03F 2200/03* (2013.01)

(58) Field of Classification Search

CPC .. H04R 3/12; H04R 5/04; H03F 3/347; H03F 2200/03
USPC ........................................................... 381/17
See application file for complete search history.

(56) References Cited

U.S. PATENT DOCUMENTS 5,594,362 A * 1/1997 Owen ................ H03K 19/1731 326/38
7,034,593 B1 * 4/2006 Duewer .................. H03M 3/30 327/198
2008/0285776 A1 * 11/2008 Wu .......................... H04R 1/04 704/201

FOREIGN PATENT DOCUMENTS

JP H05291932 A 11/1993
JP H11513556 A 11/1999
JP 2013197711 A 9/2013
JP 2015201729 A 11/2015

OTHER PUBLICATIONS

International Search Report for International Application No. PCT/JP2020/037262; Date of Mailing, Dec. 28, 2020.
PCT International Preliminary Report on Patentability with Written Opinion of the International Searching Authority for International Application No. PCT/JP2020/037262; Date of Mailing, Apr. 28, 2022.

* cited by examiner

*Primary Examiner* — Vivian C Chin
*Assistant Examiner* — Douglas J Suthers
(74) *Attorney, Agent, or Firm* — CANTOR COLBURN LLP

(57) ABSTRACT

An audio circuit includes N (N≥1) input pins each of which receive input of a digital audio signal or an analog audio signal. When analog audio signals are input to the N input pins, an audio interface circuit applies a bias voltage to each of the N input pins via a bias resistor.

11 Claims, 11 Drawing Sheets

300
320
INTERNAL CIRCUIT
312
VCC
R21
R22
314
VBIAS
R1#
310
K IN-PUTS
P#
N INPUTS
C1
CK
A1
AK
404
ANALOG SOUND SOURCE

300A
VCC
312
R21
R22
314
P$_1$
SDATA ($AL_P$)
P$_2$
LRCLK ($AL_N$)
P$_3$
BCRK ($AL_P$)
P$_4$
MCRK ($AL_N$)
SEL1$_1$
SEL1$_2$
SEL1$_3$
SEL1$_4$
R1$_1$
R1$_2$
R1$_3$
R1$_4$
310
B1$_1$
B1$_2$
B1$_3$
B1$_4$
322A
Lch
Rch
324L
324R
DAC
DAC
SEL2$_1$
SEL2$_2$
SEL2$_3$
SEL2$_4$
B2$_1$
B2$_2$
B2$_3$
B2$_4$
330
ANALOG PROCESSING CIRCUIT
320A

300B
VCC
312
R21
R22
314
330
ANALOG PROCESSING CIRCUIT
$B2_1$
$B2_2$
$SEL2_1$
$SEL2_2$
324L
DAC
324R
DAC
322B
Lch
Rch
$B1_1$
$B1_2$
$B1_3$
$R1_1$
$R1_2$
$R1_3$
$SEL1_1$
$SEL1_2$
$SEL1_3$
320B
310
$P_1$
SDATA (AL)
$P_2$
LRCLK (AR)
$P_3$
BCLK 300C
330
ANALOG PROCESSING CIRCUIT
B21
B22
SEL21
SEL22
324L
324R
DAC
DAC
322C
S/P DIF
Lch
Rch
320C
B11
B12
R11
R12
SEL11
SEL12
310
VCC
312
R21
R22
314
P1
SPDIF
(AL)
P2
(AR)

300D
330
ANALOG PROCESSING CIRCUIT
B21
B22
SEL21
SEL22
324L
324R
DAC
DAC
322D
Lch
Rch
320D
B11
B12
VCC
312
R21
R22
R11
R12
SEL11
SEL12
314
310
P1
DL
(AL)
P2
DR
(AR)

AUDIO CIRCUIT FOR INTERFACING WITH DIGITAL OR ANALOG AUDIO SIGNALS

CROSS REFERENCE TO RELATED APPLICATIONS

This application is a continuation under 35 U.S.C. § 120 of PCT/JP2020/037262, filed Sep. 30, 2020, which is incorporated herein by reference, and which claimed priority to Japanese Application No. 2019-191304, filed Oct. 18, 2019. The present application likewise claims priority under 35 U.S.C. § 119 to Japanese Application No. 2019-191304, filed Oct. 18, 2019, the entire content of which is also incorporated herein by reference.

BACKGROUND

1. Technical Field

The present disclosure relates to an audio circuit.

2. Description of the Related Art

Transmission methods for audio signals between audio Integrated Circuits (ICs) are broadly classified into analog transmission and digital transmission. An interface circuit is mounted on such an audio IC according to the transmission method.

FIG. 1A and FIG. 1B are exemplary waveform diagrams showing a digital audio signal and an analog audio signal. As shown in FIG. 1A, the digital audio signal is configured as a pulse signal that is switched between two levels, i.e., a high level (e.g., 3.3 V) and a low level (e.g., 0 V). For example, the digital audio signal may be configured as a combination of multiple pulse signals (e.g., a combination of a clock signal and serial data). Also, the digital audio signal may be configured as a single pulse signal (e.g., a Pulse Width Modulation (PWM) signal, a Pulse Density Modulation (PDM) signal, or a Direct Stream Digital (DSD) signal. In a case of using an analog audio signal for a Compact Disc (CD), for example, as shown in FIG. 1B, the analog audio signal has an analog waveform having a maximum amplitude of 2 Vrms.

FIG. 2 is a diagram showing a conventional audio IC 900. The audio IC 900 is configured to be capable of receiving both the inputs of an analog audio signal and a digital audio signal. The audio IC 900 includes an analog audio interface with two pins (Lch, Rch) and a serial input interface with four pins (SDATA, LRCLK, BCLK, MCLK).

The audio IC 900 includes a serial interface circuit (receiver) 902, D/A converters 904 and 906, and selectors 908 and 910.

In a case in which the audio IC 900 is coupled to another Integrated Circuit (IC) or device provided with an analog interface, an analog audio signal is input to the two analog input pins (Lch, Rch). In this case, the four digital input pins (SDATA, LRCLK, BCLK, MCLK) are not used. The selectors 908 and 910 select the analog audio signals input via the Lch pin and the Rch pin, and output the analog signals thus selected to an unshown internal circuit.

In a case in which the audio IC 900 is coupled to another Integrated Circuit (IC) or device provided with a digital interface, the two analog input pins (Lch, Rch) are not used. In this case, a digital audio signal is input to the four digital input pins (SDATA, LRCLK, BCLK, MCLK). The serial interface circuit 902 separates the digital audio signal into an L-channel signal and an R-channel signal. The D/A converters 904 and 906 convert the L-channel digital signal and the R-channel digital signal into analog signals. The selectors 908 and 910 select the outputs of the D/A converters 904 and 906; and output the output signals thus selected to an unshown internal circuit.

The audio IC 900 shown in FIG. 2 requires a total of six input pins, which is the sum total of the number of the analog input pins and the number of the digital input pins. Such an arrangement has a problem of requiring a large chip area and a large package area. FIG. 2 shows only one input line. However, in some cases, the audio IC 900 has around four input lines. In this case, such an arrangement requires 24 (=6×4) pins.

SUMMARY

The present disclosure has been made in order to solve such a problem.

An embodiment of the present disclosure relates to an audio circuit. The audio circuit includes: N (N≥1) input pins via which a digital audio signal or an analog audio signal is to be input; an audio interface circuit structured such that, when the analog audio signals are input to the N input pins, a bias voltage is applied to each of the N input pins via a bias resistor; and an internal circuit structured to process the analog audio signal or the digital audio signal that has passed through the audio interface circuit.

Another embodiment of the present disclosure relates to an electronic device. The electronic device is provided with any one of the audio circuits described above.

Yet another embodiment of the present disclosure relates to an in-vehicle audio system. The in-vehicle audio system is provided with any one of the audio circuits described above.

It should be noted that any combination of the components described above, or any manifestation of the present disclosure may be mutually substituted between a method, apparatus and so forth, which are also effective as an embodiment of the present disclosure. The description of the items (means for solving the problems) is by no means intended to describe all the indispensable features of the present disclosure. That is to say, any sub-combination of the features as described above is also encompassed in the technical scope of the present disclosure.

BRIEF DESCRIPTION OF THE DRAWINGS

Embodiments will now be described, by way of example only, with reference to the accompanying drawings which are meant to be exemplary, not limiting, and wherein like elements are numbered alike in several FIGURES, in which.

DETAILED DESCRIPTION

Outline of Embodiments

Figure 1A:
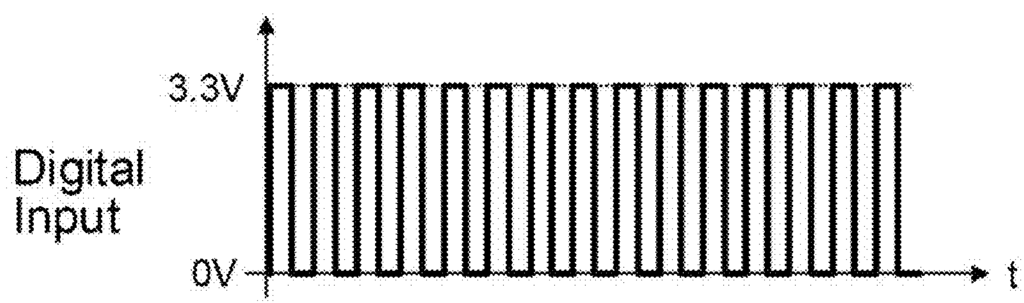
FIG. 1A and FIG. 1B are exemplary waveform diagrams showing a digital audio signal and an analog audio signal.

Description will be made regarding an outline of several example embodiments of the present disclosure. In this outline, some concepts of one or more embodiments will be described in a simplified form as a prelude to the more detailed description that is presented later in order to provide a basic understanding of such embodiments. Accordingly, the outline is by no means intended to restrict the scope of the present invention or the present disclosure. Furthermore, this outline is not an extensive overview of all conceivable embodiments and is by no means intended to restrict essential elements of the embodiments. In some cases, for convenience, the term "one embodiment" may be used herein to refer to a single embodiment (example or modification) or multiple embodiments (examples or modifications) disclosed in the present specification.

An audio circuit according to an embodiment includes: N ($N\geq1$) input pins via which a digital audio signal or an analog audio signal is to be input; an audio interface circuit structured such that, when the analog audio signals are input to the N input pins, a bias voltage is applied to each of the N input pins via a bias resistor; and an internal circuit structured to process the analog audio signal or the digital audio signal that has passed through the audio interface circuit.

With this configuration, the analog input pins and the digital input pins can be configured as shared input pins. This allows the number of pins to be reduced. It should be noted that the phrase "analog audio signals (digital audio signals) are input to the N input pins" does not mean a state in which all the N input pins are used. Rather, this means a state in which at least one of the N input pins is used.

With an embodiment, the audio interface circuit may be structured such that, when the digital audio signals are input to the N input pins, each of the N input pins is grounded via the bias resistor.

With an embodiment, the audio interface circuit may be structured such that, when the audio circuit is started up, each of the N input pins is grounded via the bias resistor. In a case in which an external circuit having a digital output is coupled to the N input pins, this is capable of preventing high voltage from being applied to the external circuit when the audio circuit is started up.

With an embodiment, the internal circuit may include: a D/A converter structured such that, when the digital audio signals are input to the N input pins, the D/A converter is set to an active state so as to convert the digital audio signals into analog signals; an output selector structured such that, when the digital audio signals are input to the N input pins, the output selector selects an output signal of the D/A converter, and when the analog audio signals are input to the N input pins, the output selector selects the analog audio signals; and an analog processing circuit structured to process an output of the output selector.

With an embodiment, the internal circuit may include: an A/D converter structured such that, when the analog audio signals are input to the N input pins, the A/D converter is set to an active state so as to convert the analog audio signals into digital signals; an output selector structured such that, when the digital audio signals are input to the N input pins, the output selector selects the digital audio signals, and when the analog audio signals are input to the N input pins, the output selector selects an output signal of the A/D converter; and a digital processing circuit structured to process an output of the output selector.

With an embodiment, the bias voltage may be ½ of a power supply voltage of the audio circuit.

With an embodiment, the audio interface circuit may include: a voltage dividing circuit structured to divide the power supply voltage into ½; a buffer structured to receive an output voltage of the voltage dividing circuit; N bias selectors each arranged such that a first input terminal thereof is coupled to an output of the buffer, and a second input terminal thereof is grounded; and N bias resistors each arranged such that one end thereof is coupled to an output terminal of the corresponding bias selector, and the other end thereof is coupled to the corresponding input pin.

With an embodiment, an arrangement may be made in which N=4. Also, the digital audio signal may be transmitted in a serial format including serial data, an LR clock, a bit clock, and a master clock.

With an embodiment, an arrangement may be made in which N=3. Also, the digital audio signal may be transmitted in a serial format including serial data, an LR clock, and a bit clock.

With an embodiment, the digital audio signal may be a PWM signal.

With an embodiment, the digital audio signal may be a differential signal.

With an embodiment, the digital audio signal may be a single-ended signal.

With an embodiment, the audio circuit may be monolithically integrated on a single substrate. Examples of such an "integrated" arrangement include: an arrangement in which all the circuit components are formed on a substrate; and an arrangement in which principal circuit components are monolithically integrated. Also, a part of the circuit components such as resistors or capacitors may be arranged in the form of components external to such a substrate in order to adjust the circuit constants. By integrating the circuit on a single chip, such an arrangement allows the circuit area to be reduced and allows the circuit elements to have uniform characteristics.

Embodiments

Description will be made below regarding the present disclosure with reference to the drawings. In each drawing, the same or similar components, members, and processes are denoted by the same reference numerals, and redundant description thereof will be omitted as appropriate. The embodiments have been described for exemplary purposes only and are by no means intended to restrict the present disclosure. Also, it is not necessarily essential for the present disclosure that all the features or a combination thereof be provided as described in the embodiments.

In the present specification, a state represented by the phrase "the member A is coupled to the member B" includes a state in which the member A is indirectly coupled to the member B via another member that does not affect the electric connection between them, or that does not damage the functions of the connection between them, in addition to a state in which they are physically and directly coupled. Similarly, a state represented by the phrase "the member C is provided between the member A and the member B" includes a state in which the member A is indirectly coupled to the member C, or the member B is indirectly coupled to the member C via another member that does not affect the electric connection between them, or that does not damage the functions of the connection between them, in addition to a state in which they are directly coupled.

Figure 3:
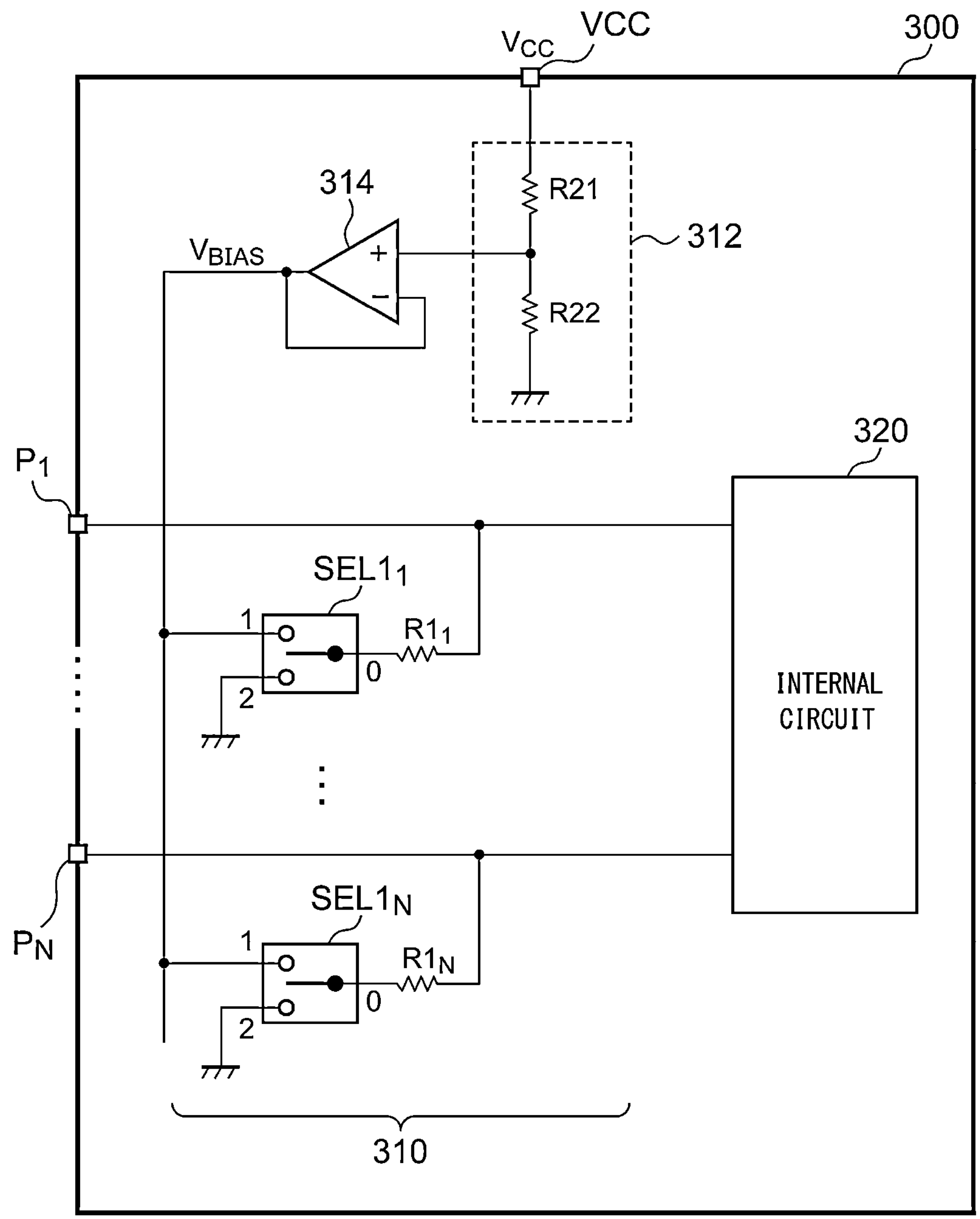
FIG. 3 is a circuit diagram showing a basic configuration of an audio circuit according to an embodiment.

FIG. 3 is a circuit diagram showing a basic configuration of an audio circuit 300 according to an embodiment. The audio circuit 300 includes N (N≥1) input pins $P_1$ through $P_N$, a power supply pin VCC, an audio interface circuit 310, and an internal circuit 320, which are integrated on a single semiconductor substrate.

A digital audio signal or an analog audio signal is exclusively and selectively input to the N input pins $P_1$ through $P_N$. The audio interface circuit 310 receives digital or analog audio signals input via the N input pins $P_1$ through $P_N$, and supplies the audio signals thus received to the internal circuit 320 configured as a downstream stage.

The audio interface circuit 310 is configured such that, when analog audio signals are input to the N input pins $P_1$ through $P_N$, a bias voltage $V_B$ is applied to the N input pins $P_1$ through $P_N$ via bias resistors $R1_1$ through $R1_N$. For example, the bias voltage $V_B$ is configured as a voltage (e.g., 7.2 V) obtained by dividing a power supply voltage $V_{CC}$ (e.g., 14.4 V) supplied to the power supply pin VCC by 2 using a resistor dividing circuit.

Furthermore, the audio interface circuit 310 is configured such that, when digital audio signals are input to the N input pins $P_1$ through $P_N$, the N input pins $P_1$ through $P_N$ are respectively grounded via the bias resistors $R1_1$ through $R1_N$.

The audio interface circuit 310 includes a voltage dividing circuit 312, a buffer 314, N bias selectors $SEL1_1$ through $SEL1_N$, and N bias resistors $R1_1$ through $R1_N$.

The voltage dividing circuit 312 includes resistors R21 and R22 each having the same resistance value and divides the power supply voltage $V_{CC}$ into ½. The buffer 314 receives the output voltage of the voltage dividing circuit 312. In a case in which digital audio signals are input, the buffer 314 can be turned off.

The i-th (1≤i≤N) bias selector $SEL1_i$ is arranged such that its input terminal (1) is coupled to the output of the buffer 314, and its second input terminal (2) is grounded.

The i-th (1≤i≤N) bias resistor $R1_i$ is arranged such that one terminal thereof is coupled to the output terminal (O) of the corresponding bias selector $SEL1_i$, and the other terminal thereof is coupled to the corresponding input pin $P_i$.

When analog audio signals are input to the N input pins $P_1$ through $P_N$, the bias selectors $SEL1_1$ through $SEL1_N$ are each switched on to the first input terminal side. When digital audio signals are input, the bias selectors $SEL1_1$ through $SEL1_N$ are each switched on to the second input terminal side.

For example, the audio circuit 300 may include a register that stores data for specifying digital input and analog input. The states of the multiple bias selectors $SEL1_1$ through $SEL1_N$ may be switched based on the data thus stored. Alternatively, the audio circuit 300 may be provided with a setting pin for specifying digital input and analog input. With this, the states of the multiple bias selectors $SEL1_1$ through $SEL1_N$ may be switched based on the electrical state of the setting pin.

The audio interface circuit 310 may be configured such that, when the audio circuit 300 is started up, i.e., when the power supply is turned on, the N input pins $P_1$ through $P_N$ are respectively grounded via the bias resistors $R1_1$ through $R1_N$ regardless of the state of the register or setting pin. For example, the audio circuit 300 includes a power-on reset circuit. The audio circuit 300 initializes the multiple bias selectors $SEL1_1$ through $SEL1_N$ such that they are switched on to the second input terminal side according to the output of the power-on reset circuit. Subsequently, after the completion of the startup of the audio circuit 300, the audio circuit 300 may switch the states of the multiple bias selectors $SEL1_1$ through $SEL1_N$ based on the state of the register or the setting pin.

Figure 4:
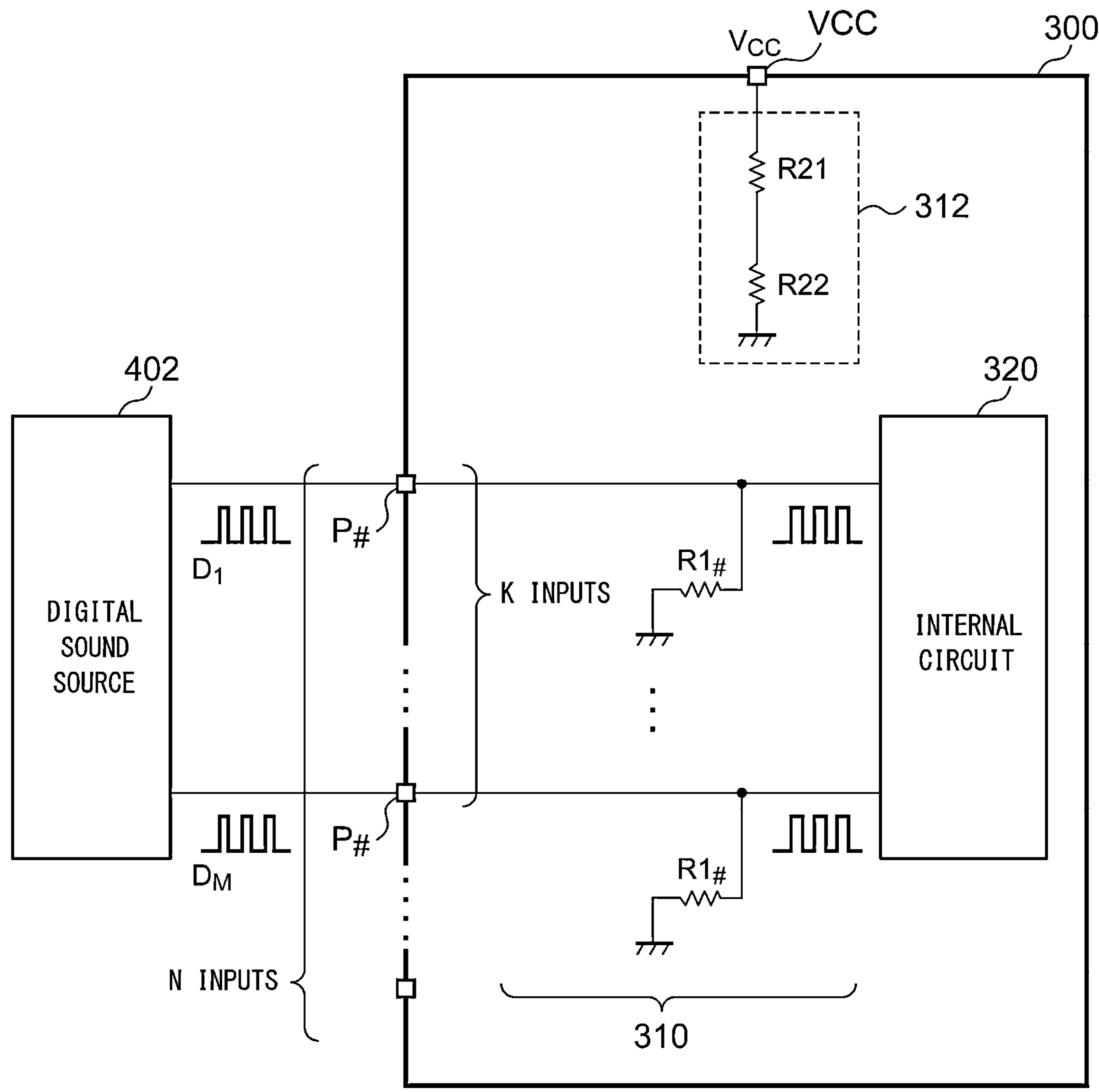
FIG. 4 is an equivalent circuit diagram of the audio circuit when digital audio signals are input.

The above is the basic configuration of the audio circuit 300. Next, description will be made regarding the operation thereof. FIG. 4 is an equivalent circuit diagram of the audio circuit 300 when digital audio signals are input. A digital sound source 402 is coupled to M (1≤M≤N) input pins from among the multiple input pins $P_1$ through $P_N$. M pulse signals $D_1$ through $D_M$ are input from the digital sound source 402. The pulse signals $D_1$ through $D_M$ are supplied to the internal circuit 320 after they pass through the audio interface circuit 310.

Figure 5:
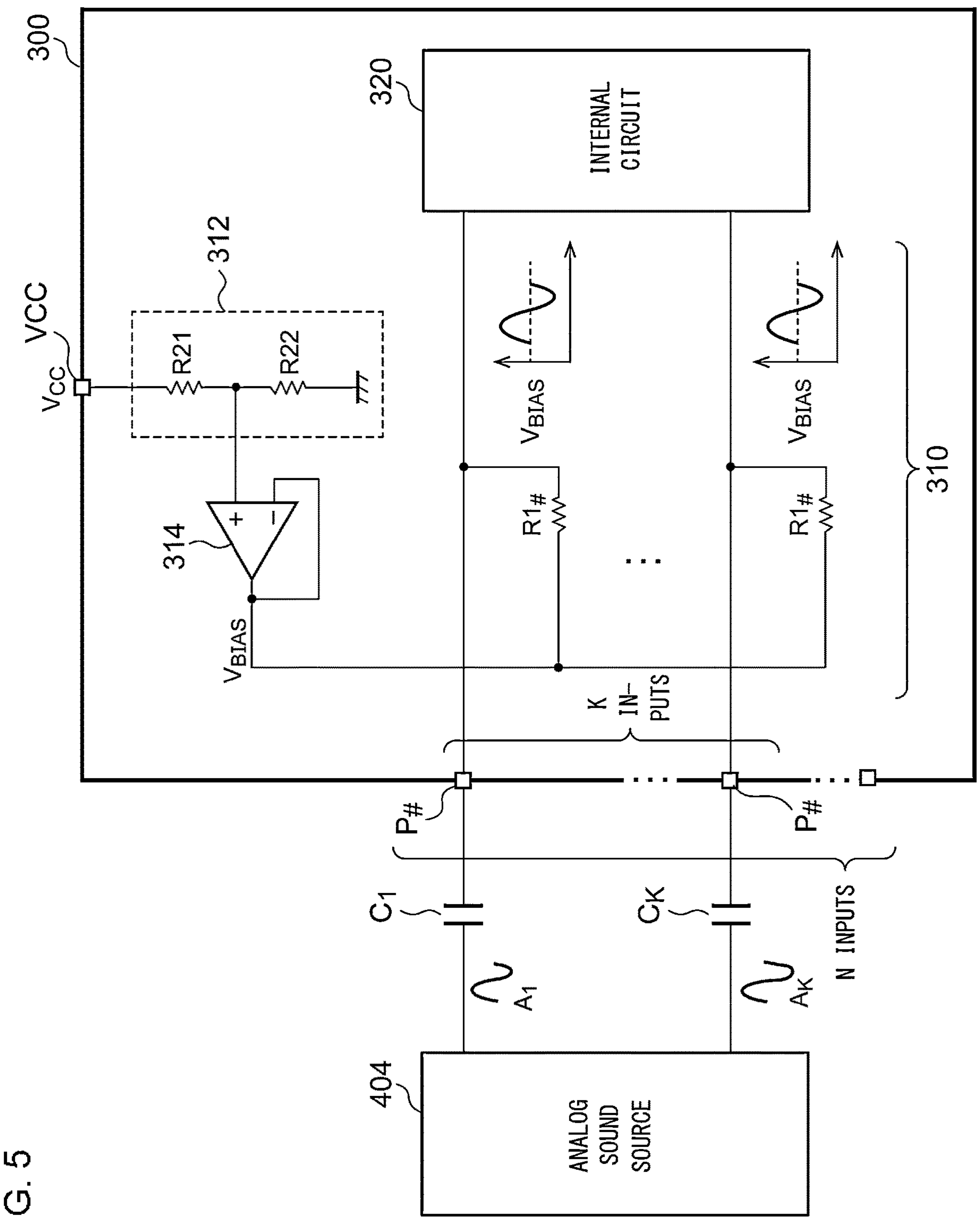
FIG. 5 is an equivalent circuit diagram of the audio circuit when analog audio signals are input.

FIG. 5 is an equivalent circuit diagram of the audio circuit 300 when analog audio signals are input. An analog sound source 404 is coupled to K (1≤K≤N) input pins from among the multiple input pins $P_1$ through $P_N$ via coupling capacitors $C_1$ through $C_K$. K analog audio signals $A_1$ through $A_K$ output from the analog sound source 404 are shifted by the audio interface circuit 310 such that their center levels each become equal to the bias voltage $V_{BIAS}$. The K analog audio signals $A_1$ through $A_K$ thus shifted are supplied to the internal circuit 320.

The above is the operation of the audio circuit 300. With the audio circuit 300, this allows the input pins to be used as both analog input pins and digital input pins. This allows the number of pins to be reduced.

Furthermore, the audio interface circuit 310 is configured such that, when the audio circuit 300 is started up, N input pins are each grounded via a resistor. With this, in a case in which a digital sound source 402 with digital output is coupled to the input pins, this is capable of preventing a high voltage ($V_{BIAS}$) from being applied to the output pins of the digital sound source 402 when the audio circuit is started up.

The present disclosure encompasses various kinds of apparatuses and circuits that can be regarded as a circuit configuration shown in FIG. 3 or otherwise that can be derived from the aforementioned description. That is to say, the present disclosure is not restricted to a specific configuration. More specific description will be made below regarding an example configuration for clarification and ease of understanding of the essence of the present disclosure and the circuit operation. That is to say, the following description will by no means be intended to restrict the technical scope of the present disclosure.

Example 1

Figure 6:
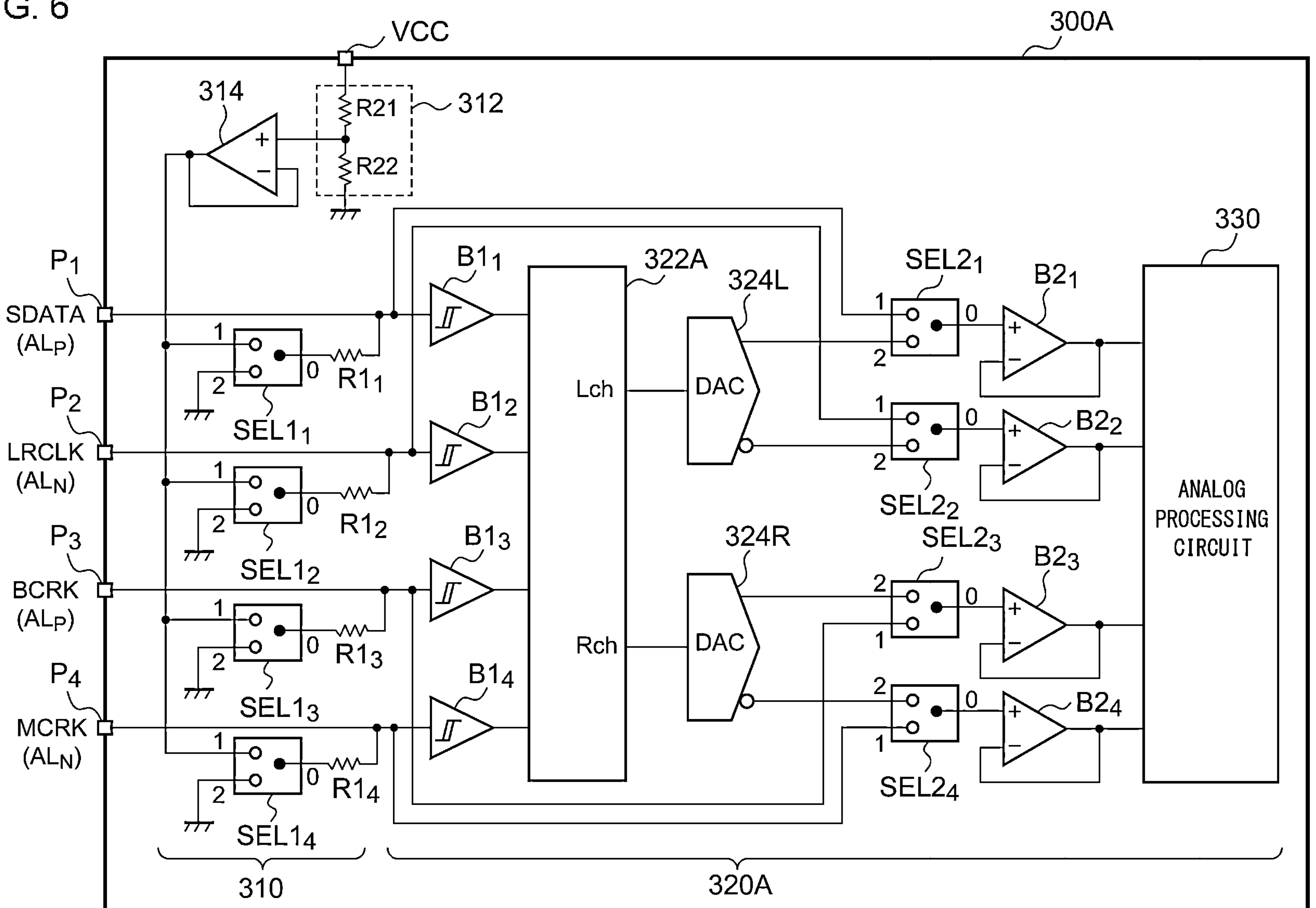
FIG. 6 is a circuit diagram showing an audio circuit according to an example 1.

FIG. 6 is a circuit diagram showing an audio circuit 300A according to an example 1. Description will be made in this example regarding an arrangement in which N=4. The audio circuit 300A supports input of a serial audio signal including serial data SDATA, LR clock LRCLK, bit clock BCLK, and master clock MCLK as digital audio signals. Examples of such a digital audio signal include PCM audio data in the I'S format. The digital audio signals include two-channel audio signals (which will be referred to as an "L-channel audio signal" and an "R-channel audio signal" for convenience). In a case of employing a multi-channel audio signal, e.g., four-channel audio signal, the time division multiplexing (TDM) format may be employed.

Furthermore, the audio circuit 300A supports differential input of a two-channel (L-channel and R-channel) audio signal in a differential (balanced) format.

Figure 1B:
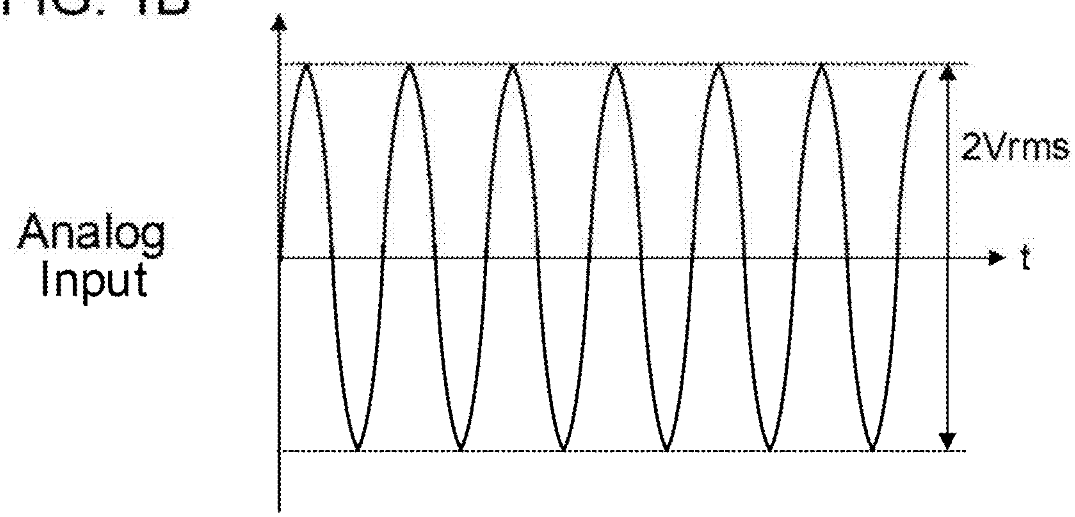

In a case in which a digital sound source is connected, serial data SDATA, LR clock LRCLK, bit clock BCLK, and master clock MCLK are input to the first input pin $P_1$ through the fourth input pin $P_4$. These signals each correspond to the pulse signal shown in FIG. 1.

In a case in which an analog sound source is connected, such an arrangement allows differential analog audio signals $AL_P$ and $AL_N$ for each channel (e.g., for the L channel) to be input via the first input pin $P_1$ and the second input pin $P_2$. Furthermore, such an arrangement allows differential analog audio signals $AR_P$ and $AR_N$ for another channel (e.g., the R channel) to be input via the third input pin $P_3$ and the fourth input pin $P_4$.

The internal circuit 320A includes Schmitt buffers $B1_1$ through $B1_4$, a serial audio interface circuit 322A, D/A converters 324L and 324R, output selectors $SEL2_1$ through $SEL2_4$, output buffers $B2_1$ through $B2_4$, and an analog processing circuit 330.

When digital audio signals are input to the input pins $P_1$ through $P_4$, the serial audio interface circuit 322A and the D/A converters 324L and 324R are set to the active state. In this state, the serial data thus received is separated into an L-channel digital signal and an R-channel digital signal. The D/A converter 324L converts the L-channel digital signal into an analog signal. The D/A converter 324R converts the R-channel digital signal into an analog signal. In the example 1, the D/A converters 324L and 324R each have a differential output. It should be noted that the D/A converters 324L and 324R are each configured to have a common digital unit.

When digital audio signals are input to the input pins $P_1$ through $P_4$, the output selectors $SEL2_1$ through $SEL2_4$ select the output signals of the D/A converters 324L and 324R. When analog audio signals are input to the input pins $P_1$ through $P_4$, the output selectors $SEL2_1$ through $SEL2_4$ select the analog audio signals thus input.

Specifically, the output selector $SEL2_1$ is arranged such that its first input terminal (1) is coupled to the input pin $P_1$ and its second input terminal (2) is coupled to a positive electrode output of the D/A converter 324L. The output selector $SEL2_2$ is arranged such that its first terminal (1) is coupled to the input pin $P_2$ and its second input terminal (2) is coupled to a negative electrode output of the D/A converter 324L. The output selector $SEL2_3$ is arranged such that its first input terminal (1) is coupled to the input pin $P_3$ and its second input terminal (2) is coupled to a positive electrode output of the D/A converter 324R. The output selector $SEL2_4$ is arranged such that its first input terminal (1) is coupled to the input pin $P_4$ and its second input terminal (2) is coupled to a negative electrode output of the D/A converter 324R.

The output buffers $B2_1$ through $B2_4$ receive the outputs of the output selectors $SEL2_1$ through $SEL2_4$, and supply the outputs thus received to the analog processing circuit 330 configured as a downstream stage. It should be noted that the output buffers $B2_1$ through $B2_4$ may be omitted.

Figure 2:
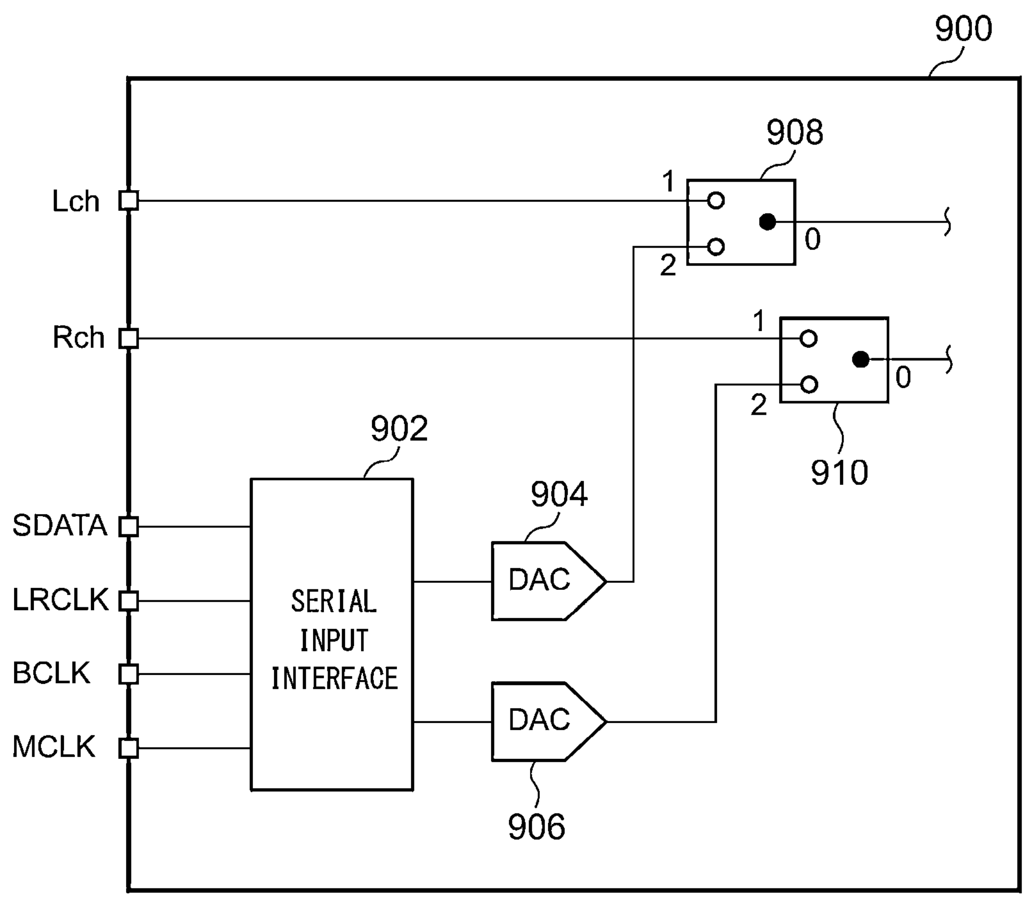
FIG. 2 is a diagram showing a conventional audio IC.

With the audio circuit 300A, this allows digital audio signals in a serial format or differential analog audio signals to be received via the four input pins $P_1$ through $P_4$. The number of input pins of the audio circuit 300A is two less than that of the audio circuit 900 shown in FIG. 2.

It should be noted that, as an effective modification of the audio circuit 300A shown in FIG. 6, the D/A converters 324L and 324R may be configured to support a single-ended output. Alternatively, single-ended analog audio signals may be input to two from among the input pins $P_1$ through $P_4$.

Example 2

Figure 7:
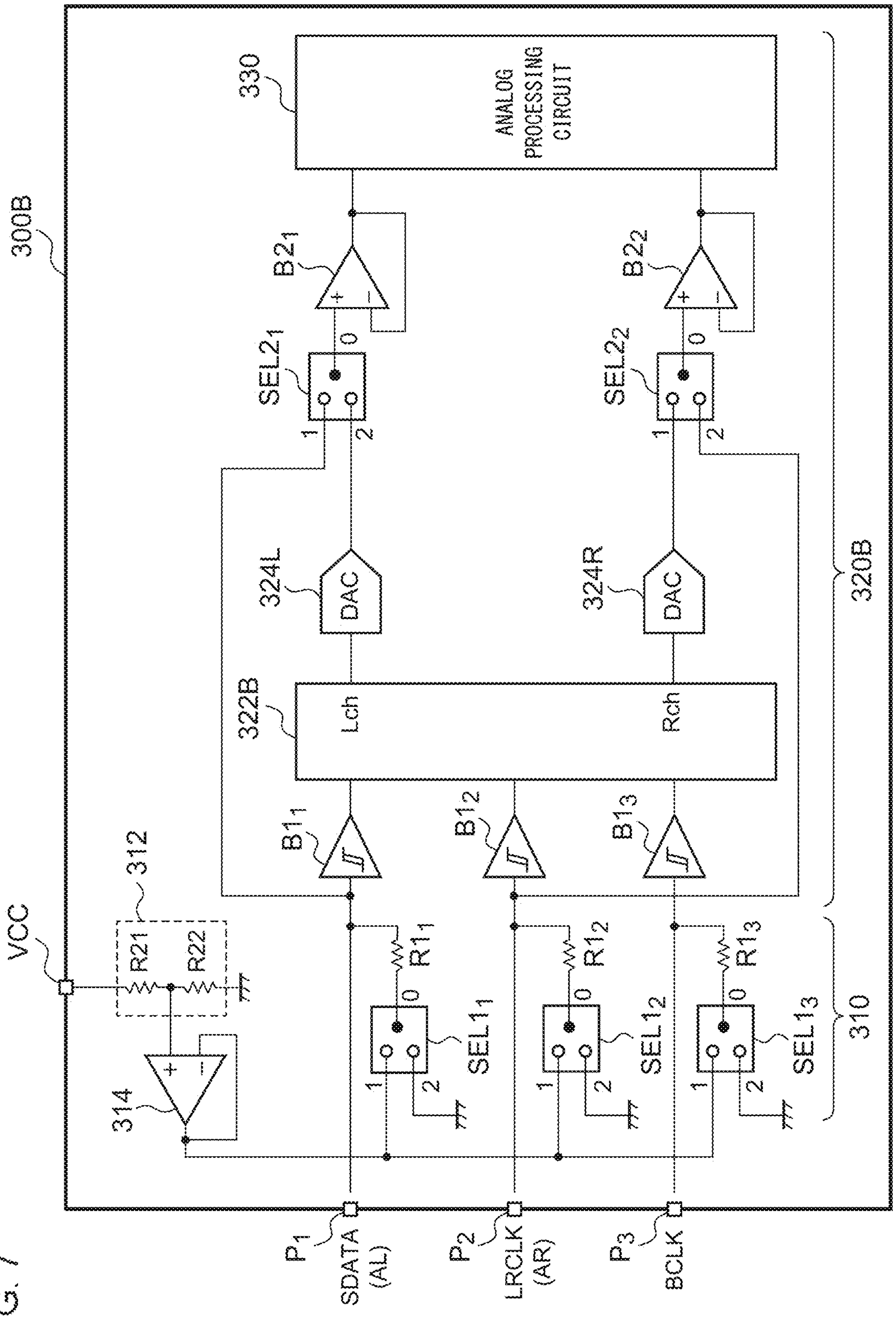
FIG. 7 is a circuit diagram showing an audio circuit according to an example 2.

FIG. 7 is a circuit diagram showing an audio circuit 300B according to an example 2. Description will be made in this example regarding an arrangement in which N=3. The audio circuit 300B supports input of a serial audio signal including serial data SDATA, LR clock LRCLK, and bit clock BCLK as digital audio signals. Examples of such a digital audio signal include PCM audio data in the $I^2S$ format. The digital audio signals include two-channel audio signals (which will be referred to as an "L-channel audio signal" and an "R-channel audio signal" for convenience). In a case of employing a multi-channel audio signal, e.g., four-channel audio signal, the time division multiplexing (TDM) format may be employed.

Furthermore, the audio circuit 300B supports input of two-channel (L-channel and R-channel) audio signals AL and AR in a single-ended (unbalanced) format.

In a case in which a digital sound source is connected, serial data SDATA, LR clock LRCLK, and bit clock BCLK are input to the first input pin $P_1$ through the third input pin $P_3$. These signals each correspond to the pulse signal shown in FIG. 1.

In a case in which an analog sound source is connected, such an arrangement allows a single-ended analog audio signal AL for each channel (e.g., for the L channel) to be input via the first input pin $P_1$. Furthermore, such an arrangement allows a single-ended analog audio signal AR for another channel (e.g., the R channel) to be input via the second input pin $P_2$.

The internal circuit 320B includes Schmitt buffers $B1_1$ through $B1_3$, a serial audio interface circuit 322B, D/A converters 324L and 324R, output selectors $SEL2_1$ and $SEL2_2$, output buffers $B2_1$ and $B2_2$, and an analog processing circuit 330.

When digital audio signals are input to the input pins $P_1$ through $P_3$, the serial audio interface circuit 322B and the D/A converters 324L and 324R are set to the active state. In this state, the serial data thus received is separated into an L-channel digital signal and an R-channel digital signal. The D/A converter 324L converts the L-channel digital signal into an analog signal. The D/A converter 324R converts the R-channel digital signal into an analog signal. In the example 2, the D/A converters 324L and 324R each have a single-ended output.

When digital audio signals are input to the input pins $P_1$ through $P_3$, the output selectors $SEL2_1$ and $SEL2_2$ select the output signals of the D/A converters 324L and 324R. When analog audio signals are input to the input pins $P_1$ and $P_2$, the output selectors $SEL2_1$ and $SEL2_2$ select the analog audio signals thus input.

Specifically, the output selector $SEL2_1$ is arranged such that its first input terminal (1) is coupled to the input pin $P_1$ and its second input terminal (2) is coupled to an output of the D/A converter 324L. The output selector $SEL2_2$ is arranged such that its first input terminal (1) is coupled to the input pin $P_2$ and its second input terminal (2) is coupled to an output of the D/A converter 324R.

The output buffers $B2_1$ and $B2_2$ receive the outputs of the output selectors $SEL2_1$ and $SEL2_2$, and supply the outputs thus received to the analog processing circuit 330 configured as a downstream stage. It should be noted that the output buffers $B2_1$ and $B2_2$ may be omitted.

With the audio circuit 300B, this allows digital audio signals in a serial format or a single-ended analog audio signal to be received via the three input pins $P_1$ through $P_3$. The number of input pins of the audio circuit 300B is two less than that of the audio circuit 900 shown in FIG. 2.

Example 3

Figure 8:
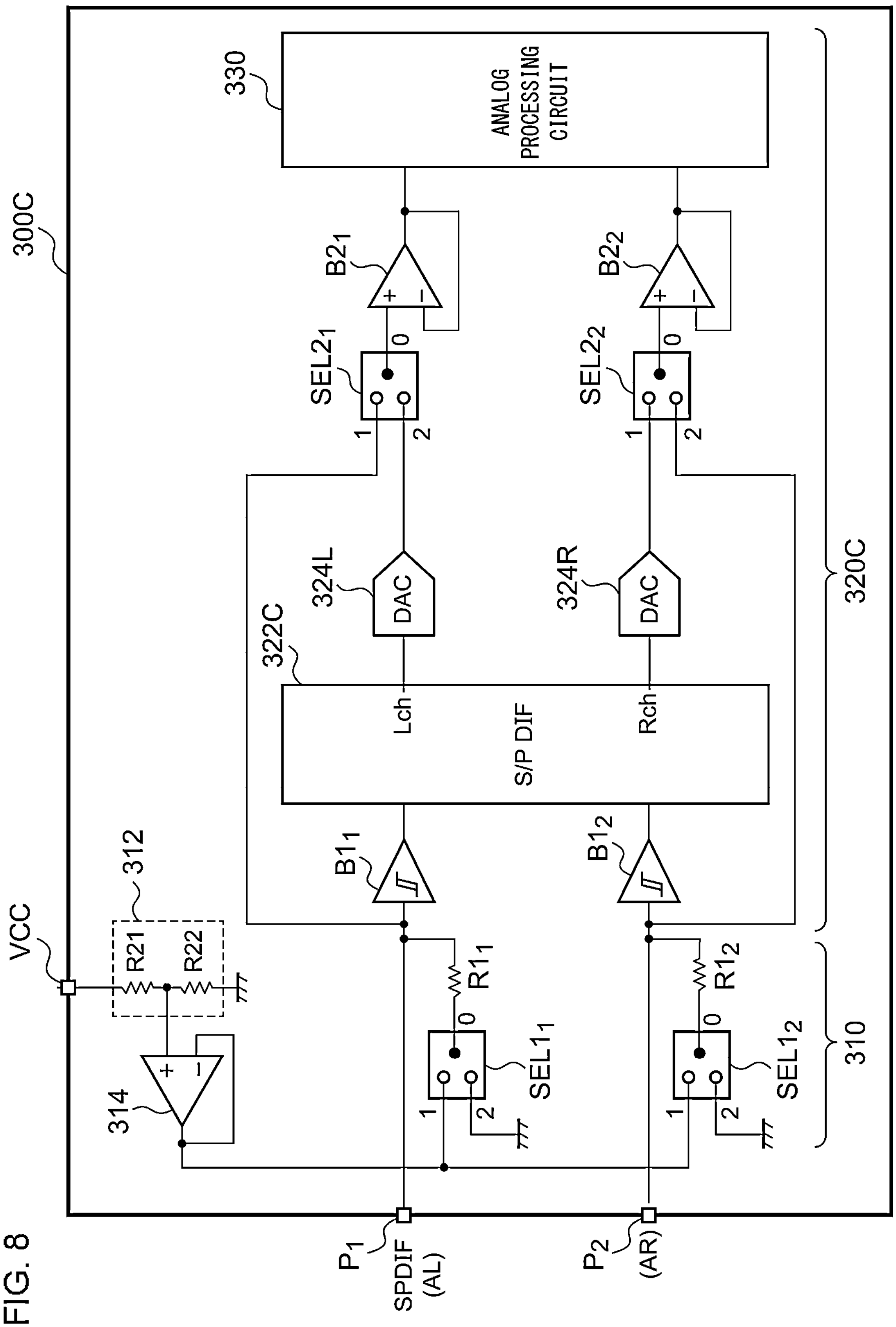
FIG. 8 is a circuit diagram showing an audio circuit according to an example 3.

FIG. 8 is a circuit diagram showing an audio circuit 300C according to an example 3. Description will be made in this example regarding an arrangement in which N=2. The audio circuit 300C supports input of a signal in the S/PDIF (Sony Philips Digital InterFace) format as a digital audio signal.

Furthermore, the audio circuit 300C supports input of two-channel (L-channel and R-channel) audio signals AL and AR in a single-ended (unbalanced) format.

In a case in which a digital sound source is connected, an S/PDIF signal is input to the first input pin $P_1$.

In a case in which an analog sound source is connected, such an arrangement allows a single-ended analog audio signal AL for each channel (e.g., for the L channel) to be input via the first input pin $P_1$. Furthermore, such an arrangement allows a single-ended analog audio signal AR for another channel (e.g., the R channel) to be input via the second input pin $P_2$.

The internal circuit 320C includes Schmitt buffer $B1_1$ through $B1_4$, an S/PDIF circuit 322C, D/A converters 324L and 324R, output selectors $SEL2_1$ through $SEL2_2$, output buffers $B2_1$ through $B2_2$, and an analog processing circuit 330.

When an S/PDIF signal is input to the input pin $P_1$, the S/PDIF circuit 322C and the D/A converters 324L and 324R are set to the active state. In this state, the S/PDIF signal thus received is separated into an L-channel digital signal and an R-channel digital signal. The D/A converter 324L converts the L-channel digital signal into an analog signal. The D/A converter 324R converts the R-channel digital signal into an analog signal. The other configuration is the same as that of the internal circuit 320B shown in FIG. 7 (example 2).

With the audio circuit 300C, this allows digital audio signals in a serial format or single-ended analog audio signals to be received via the two input pins $P_1$ and $P_2$.

Example 4

Figure 9:
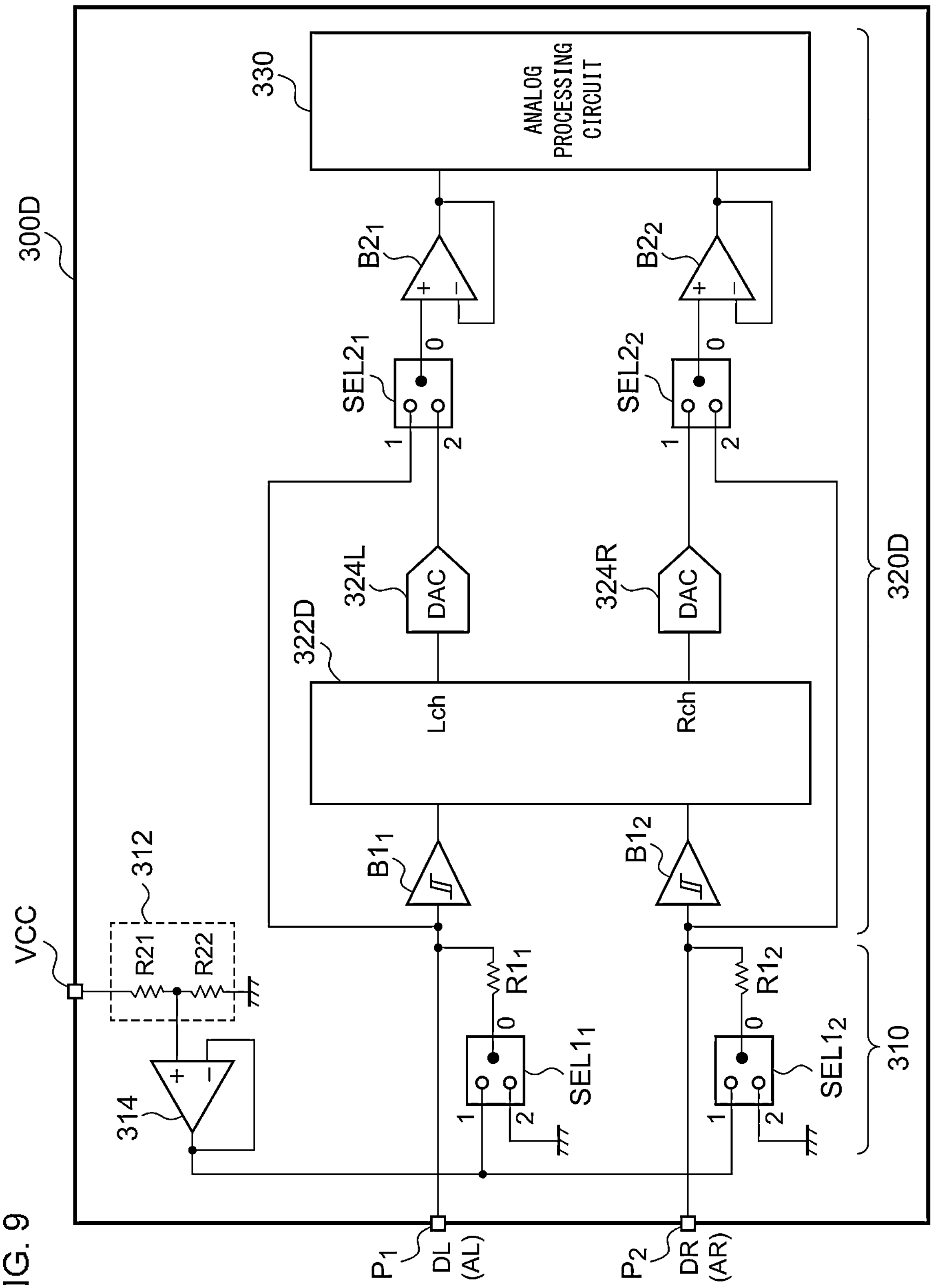
FIG. 9 is a circuit diagram showing an audio circuit according to an example 4.

FIG. 9 is a circuit diagram showing an audio circuit 300D according to an example 4. Description will be made in this example regarding an arrangement in which N=2. The audio circuit 300D supports direct input of pulse modulation signals DL and DR such as a PDM signal (DSD signal), PWM signal, or the like.

Furthermore, the audio circuit 300D supports input of two-channel (L-channel and R-channel) audio signals AL and AR in a single-ended (unbalanced) format.

In a case in which a digital sound source is connected, such an arrangement allows an L-channel pulse modulation signal DL and an R-channel pulse modulation signal DR to be input via the input pins $P_1$ and $P_2$, respectively.

In a case in which an analog sound source is connected, such an arrangement allows a single-ended analog audio signal Al for each channel (e.g., for the L channel) to be input via the first input pin $P_1$. Furthermore, such an arrangement allows another single-ended analog audio signal AR for another channel (e.g., the R channel) to be input via the second input pin $P_2$.

The internal circuit 320D includes Schmitt buffers $B1_1$ and $B1_2$, a decoder circuit 322D, D/A converters 324L and 324R, output selectors $SEL2_1$ and $SEL2_2$, output buffers $B2_1$ and $B2_2$, and an analog processing circuit 330.

When pulse modulation signals DL and DR are input to the input pins $P_1$ and $P_2$, the decoder circuit 322D is set to the active state. In this state, the pulse modulation signals DL and DR thus received are decoded. The D/A converter 324L converts the L-channel digital signal into an analog signal. The D/A converter 324R converts the R-channel digital signal into an analog signal. The decoder circuit 322D and the D/A converters 324L and 324R may be replaced by an analog lowpass filter. The other configuration is the same as that of the internal circuit 320B shown in FIG. 7 (example 2).

With the audio circuit 300D, this allows pulse-modulated digital audio signals or single-ended analog audio signals to be received via the two input pins $P_1$ and $P_2$.

Example 5

Figure 10:
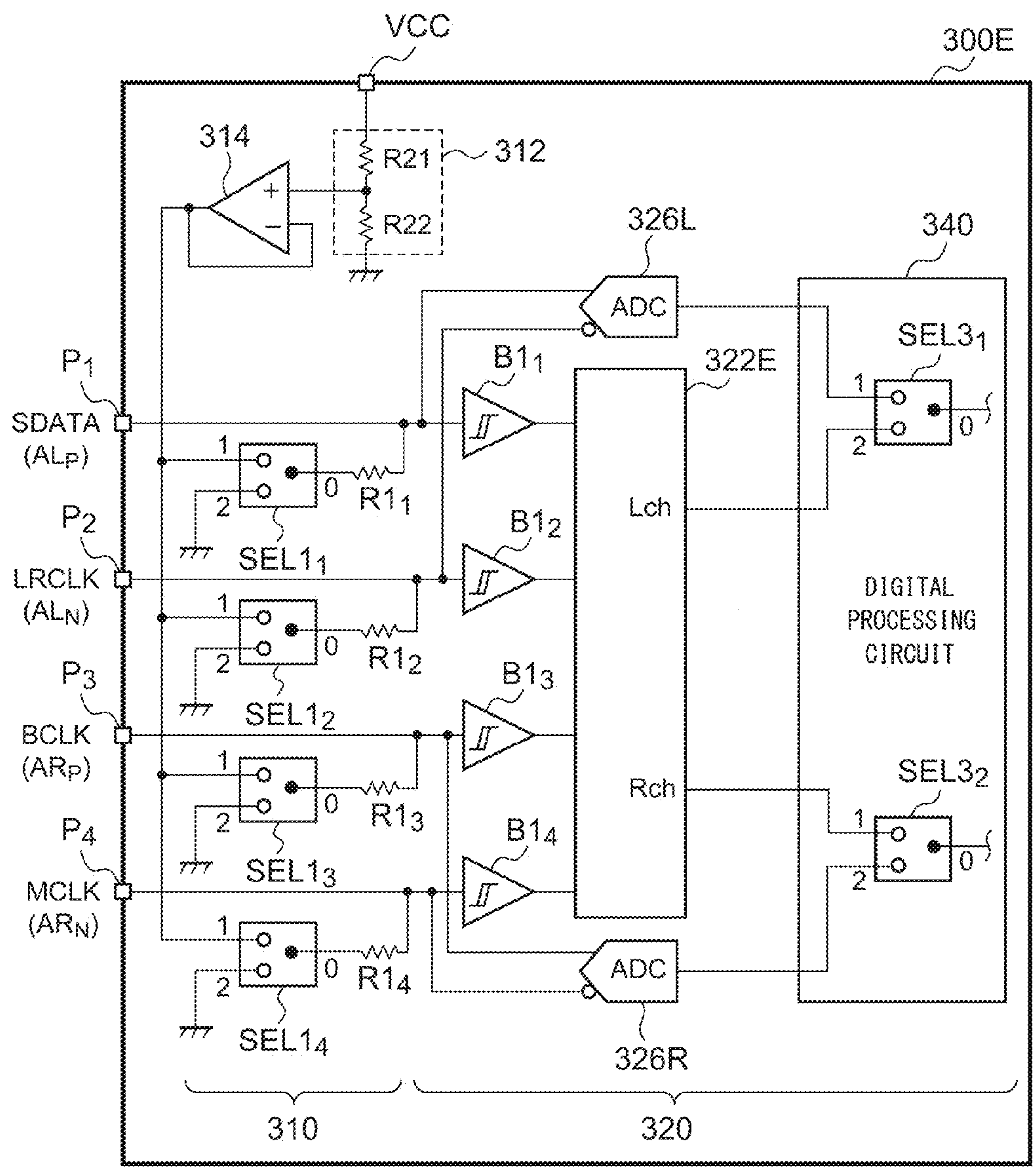
FIG. 10 is a circuit diagram showing an audio circuit according to an example 5.

Description has been made in the examples 1 through 4 regarding an audio circuit provided with the analog processing circuit 330. Also, the present disclosure is applicable to an audio circuit provided with a digital processing circuit 340. FIG. 10 is a circuit diagram showing an audio circuit 300E according to an example 5. The audio circuit 300E is capable of receiving the same signals as those that can be received by the audio circuit 300A shown in FIG. 6. Instead of the analog processing circuit 330 and the D/A converters 324, the audio circuit 300E includes a digital processing circuit 340 and A/D converters 326.

When analog audio signals are input to the input pins $P_1$ through $P_4$, the A/D converters 326L and 326R are set to the active state. In this state, the A/D converters 326L and 326R each convert the analog audio signal to a digital signal. Specifically, the A/D converter 326L has a differential input and converts L-channel differential analog signals $AL_P$ and $AL_N$ input via the input pins $P_1$ and $P_2$ into a digital signal. Furthermore, the A/D converter 326R has a differential input and converts R-channel differential analog signals $AR_P$ and $AR_N$ input via the input pins $P_3$ and $P_4$ into a digital signal.

When analog signals are input to the input pins $P_1$ through $P_4$, the digital processing circuit 340 processes the outputs of the A/D converters 326L and 326R. When digital signals are input to the input pins $P_1$ through $P_4$, the digital processing circuit 340 processes the output of the serial audio interface circuit 322E.

For example, the digital processing circuit 340 may include output selectors $SEL3_1$ and $SEL3_2$ configured such that, when digital signals are input to the input pins $P_1$ through $P_4$, the selectors $SEL3_1$ and $SEL3_2$ select the digital audio signals, and when analog signals are input to the input pins $P_1$ through $P_4$, the selectors $SEL3_1$ and $SEL3_2$ select the outputs of the A/D converters 326.

Modification 1

In the same manner as in the example 5, in the examples 2 through 4, the analog processing circuit 330 can be replaced by the digital processing circuit 340.

Modification 2

Figure 11A:
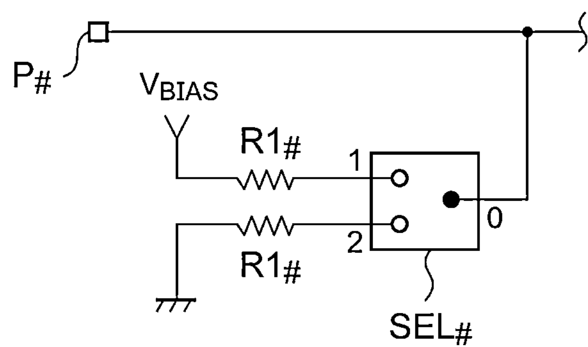
FIG. 11A and FIG. 11B are circuit diagrams each showing an audio interface circuit according to a modification 2.
Figure 11B:
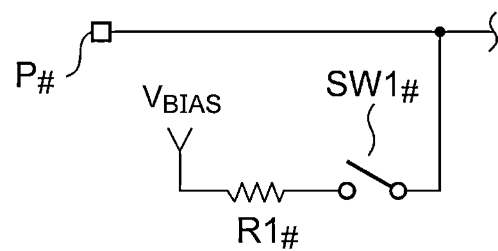

The configuration of the audio interface circuit 310 is not restricted to an arrangement shown in FIG. 3. FIG. 11A and FIG. 11B are circuit diagrams each showing the audio interface circuit 310 according to a modification 2. FIG. 11A and FIG. 11B show only a portion that corresponds to a single pin. In a modification shown in FIG. 11A, two bias resistors R1$_{\#}$ are provided on the input side of a bias selector SEL1$_{\#}$. In a modification shown in FIG. 11B, instead of the bias selector SEL1$_{\#}$, a switch SW1$_{\#}$ is provided. When an analog audio signal is input, the switch SW1$_{\#}$ is turned on. In this state, the bias voltage $V_{BIAS}$ is applied to the input pin $P_{\#}$ via the bias resistor R1$_{\#}$ and the switch SW1$_{\#}$. The bias resistor R1$_{\#}$ and the switch SW1$_{\#}$ may be swapped.

What is claimed is:

1. An audio circuit comprising:

N input pins, wherein N≥1, via which a digital audio signal or an analog audio signal is to be input;

an audio interface circuit structured such that, when the analog audio signals are input to the N input pins, a bias voltage is applied to each of the N input pins via a bias resistor; and an internal circuit structured to process the analog audio signal or the digital audio signal that has passed through the audio interface circuit, wherein the internal circuit comprises:

a D/A converter structured such that, when the digital audio signals are input to the N input pins, the D/A converter is set to an active state so as to convert the digital audio signals into analog signals;

an output selector structured such that, when the digital audio signals are input to the N input pins, the output selector selects an output signal of the D/A converter, and when the analog audio signals are input to the N input pins, the output selector selects the analog audio signals; and an analog processing circuit structured to process an output of the output selector.

2. The audio circuit according to claim 1, wherein the audio interface circuit is structured such that, when the digital audio signals are input to the N input pins, each of the N input pins is coupled to a grounded via the bias resistor.

3. The audio circuit according to claim 2, wherein the audio interface circuit is structured such that, when the audio circuit is started up, each of the N input pins is grounded via the bias resistor.

4. The audio circuit according to claim 1, wherein N=4, and wherein the digital audio signal is transmitted in a serial format including serial data, an LR clock, a bit clock, and a master clock.

5. The audio circuit according to claim 1, wherein N=3, and wherein the digital audio signal is transmitted in a serial format including serial data, an LR clock, and a bit clock.

6. The audio circuit according to claim 1, wherein the digital audio signal is a PWM signal.

7. The audio circuit according to claim 1, wherein the digital audio signal is a differential signal.

8. The audio circuit according to claim 1, wherein the digital audio signal is a single-ended signal.

9. The audio circuit according to claim 1, monolithically integrated on a single substrate.

10. An audio circuit comprising:

N input pins, wherein N≥1, via which a digital audio signal or an analog audio signal is to be input;

an audio interface circuit structured such that, when the analog audio signals are input to the N input pins, a bias voltage is applied to each of the N input pins via a bias resistor; and an internal circuit structured to process the analog audio signal or the digital audio signal that has passed through the audio interface circuit, wherein the internal circuit comprises:

an A/D converter structured such that, when the analog audio signals are input to the N input pins, the A/D converter is set to an active state so as to convert the analog audio signals into digital signals;

an output selector structured such that, when the digital audio signals are input to the N input pins, the output selector selects the digital audio signals, and when the analog audio signals are input to the N input pins, the output selector selects an output signal of the A/D converter; and a digital processing circuit structured to process an output of the output selector.

11. An audio circuit comprising:

N input pins, wherein N≥1, via which a digital audio signal or an analog audio signal is to be input;

an audio interface circuit structured such that, when the analog audio signals are input to the N input pins, a bias voltage is applied to each of the N input pins via a bias resistor; and an internal circuit structured to process the analog audio signal or the digital audio signal that has passed through the audio interface circuit, wherein the bias voltage is ½ of a power supply voltage of the audio circuit, wherein the audio interface circuit comprises:

a voltage dividing circuit structured to divide the power supply voltage into ½;

a buffer structured to receive an output voltage of the voltage dividing circuit;

N bias selectors each arranged such that a first input terminal thereof is coupled to an output of the buffer, and a second input terminal thereof is grounded; and N bias resistors each arranged such that one end thereof is coupled to an output terminal of the corresponding bias selector, and the other end thereof is coupled to the corresponding input pin.

* * * * *